(12) United States Patent  
Ryuzaki et al.

(10) Patent No.: US 7,969,520 B2  
(45) Date of Patent: *Jun. 28, 2011

(54) LIQUID CRYSTAL DISPLAY DEVICE AND DIELECTRIC FILM USABLE IN THE LIQUID CRYSTAL DISPLAY DEVICE

(75) Inventors: Daisuke Ryuzaki, Kodaira (JP); Kazuyoshi Torii, Higashimurayama (JP); Mutsuko Hatano, Kokubunji (JP); Daisuke Sonoda, Chiba (JP); Toshiki Kaneko, Chiba (JP)

(73) Assignee: Hitachi Displays, Ltd., Chiba-Ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/500,639

(22) Filed: Jul. 10, 2009

(65) Prior Publication Data

US 2009/0273751 A1 Nov. 5, 2009

Related U.S. Application Data

(63) Continuation of application No. 11/583,882, filed on Oct. 20, 2006, now Pat. No. 7,586,554.

(30) Foreign Application Priority Data

Oct. 21, 2005 (JP) .................................. 2005-306988

(51) Int. Cl.
*G02F 1/136* (2006.01)

(52) U.S. Cl. ......................................................... 349/43
(58) Field of Classification Search .................. None
See application file for complete search history.

(56) References Cited

U.S. PATENT DOCUMENTS

2007/0070266 A1 3/2007 Ochiai et al.

FOREIGN PATENT DOCUMENTS

| JP | 2000-181069 | 6/2000 |
|---|---|---|
| JP | 2000-243834 | 9/2000 |
| JP | 2002-072504 | 3/2002 |
| JP | 2002-353465 | 12/2002 |
| JP | 2003-324201 | 11/2003 |
| JP | 2004-053838 | 2/2004 |
| JP | 2004-133239 | 4/2004 |

*Primary Examiner* — Sung H Pak
(74) *Attorney, Agent, or Firm* — Antonelli, Terry, Stout & Kraus, LLP.

(57) ABSTRACT

The present invention provides a liquid crystal display device with high image visibility at low power consumption and produced at low cost by using an interlayer dielectric film, which has low dielectric constant, high heat-resistant property, high optical transmissivity, high film thickness and high flattening property produced at low cost. An organic siloxane dielectric film is used as an interlayer dielectric film of the liquid crystal display device. A ratio of nitrogen content to silicon content (Ni content/Si content) in the interlayer dielectric film is controlled to 0.04 or more in the element ratio. The limiting film thickness to suppress and limit the cracking caused by the thickening of the interlayer dielectric film is set to 1.5 μm or more.

14 Claims, 15 Drawing Sheets

F I G. 3
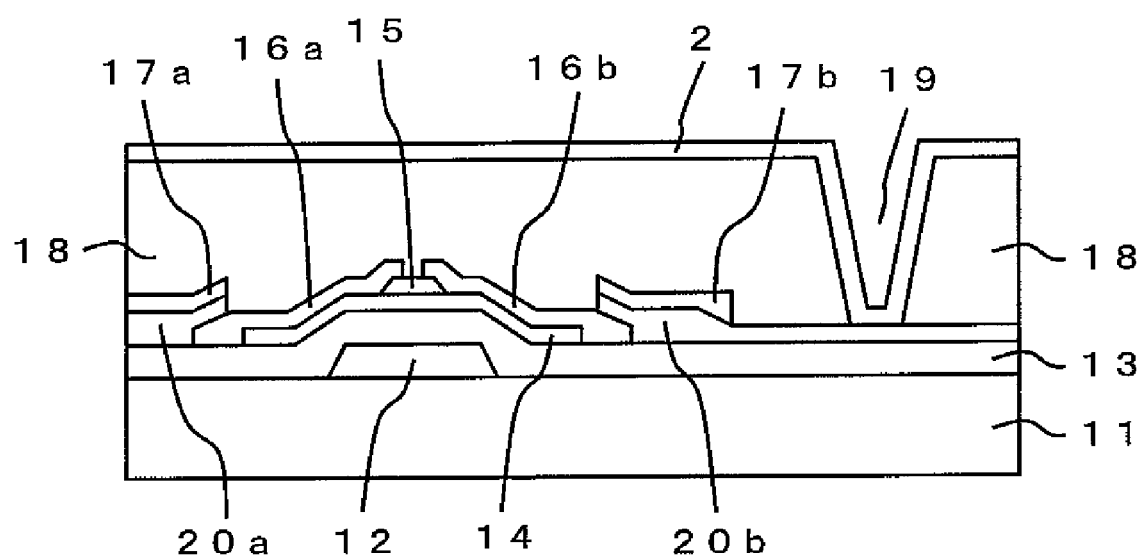

F I G. 6
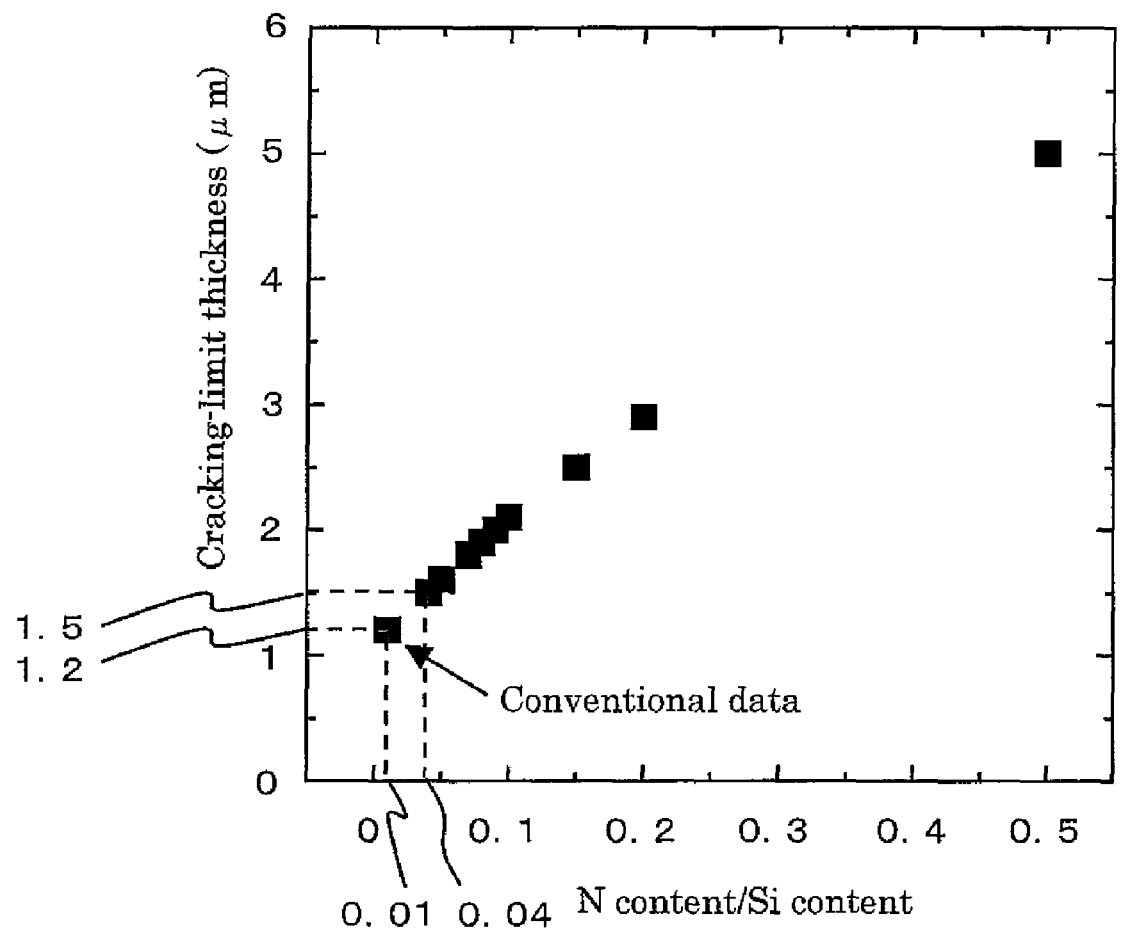

F I G. 7
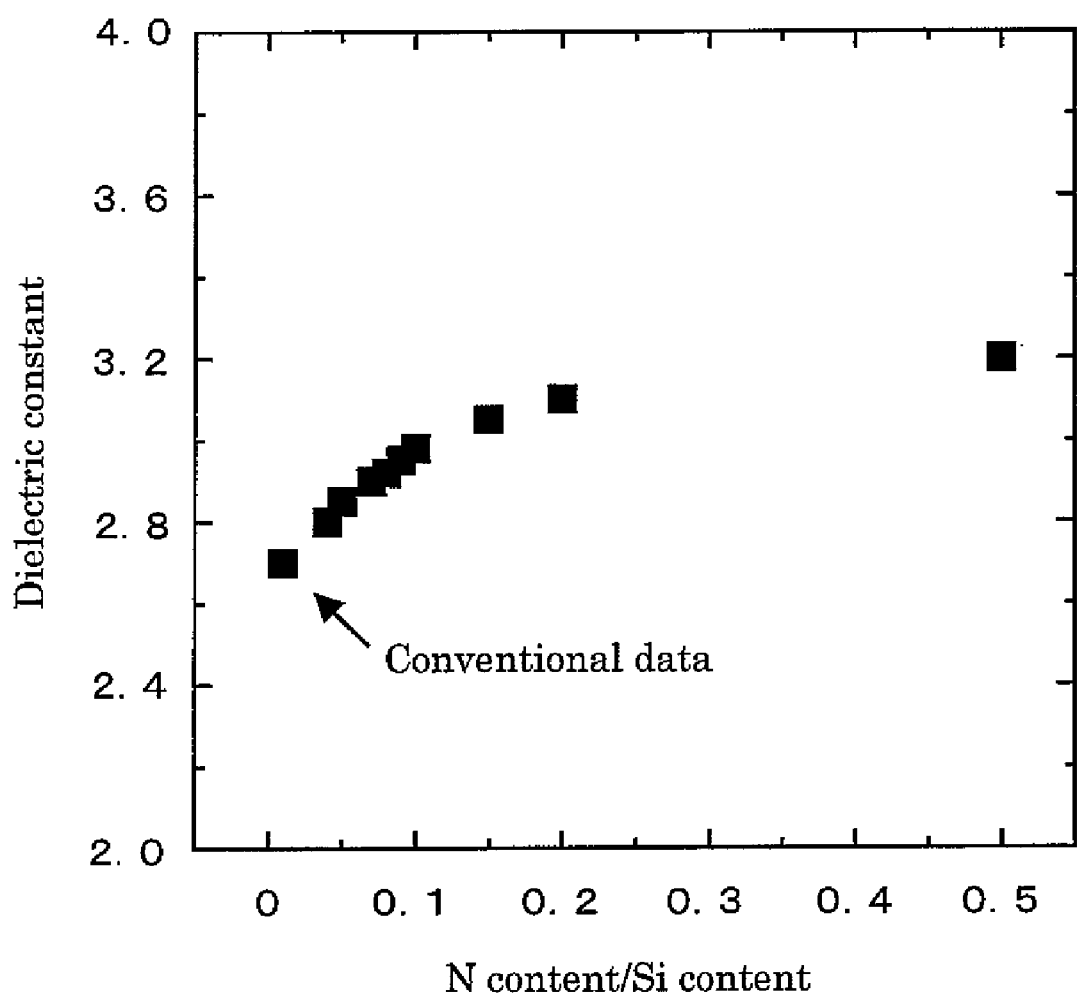

F I G. 1 2 (a)
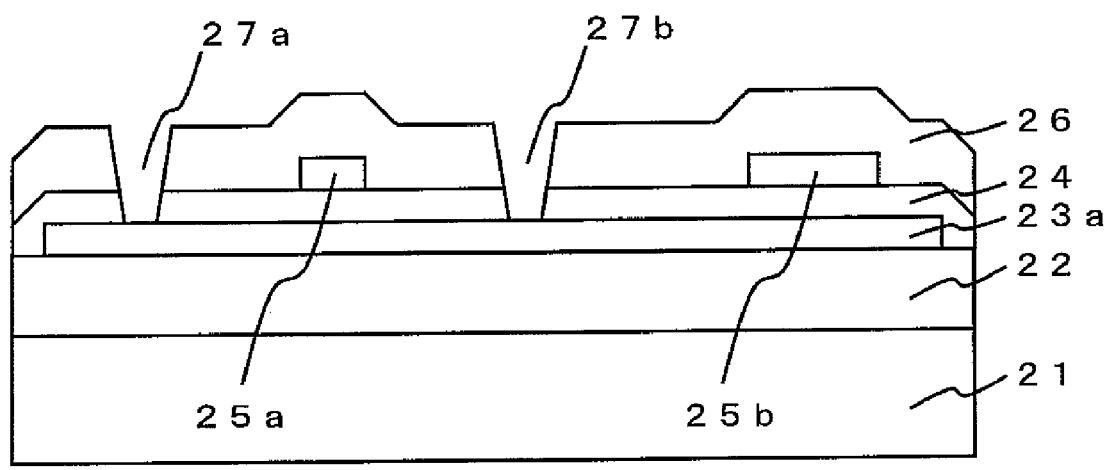
F I G. 1 2 (b)
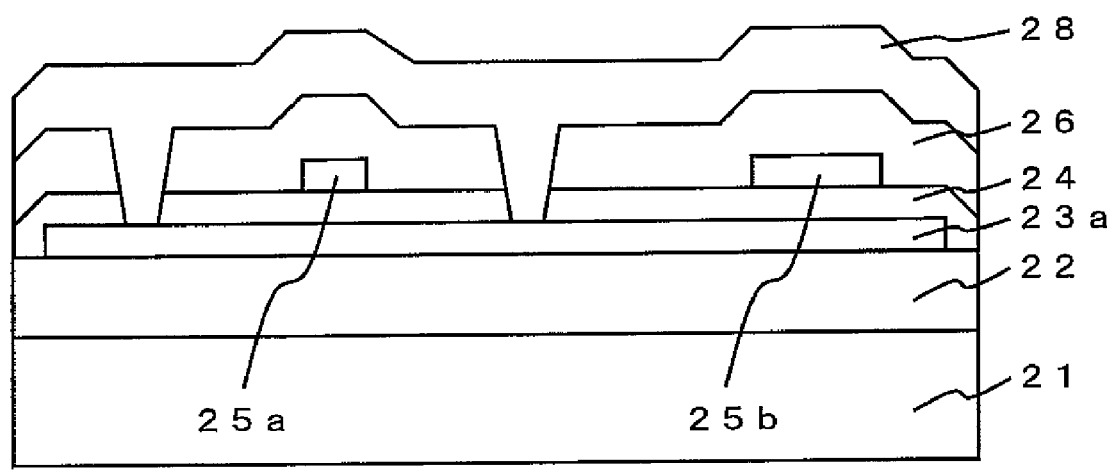

F I G. 1 3 (a)
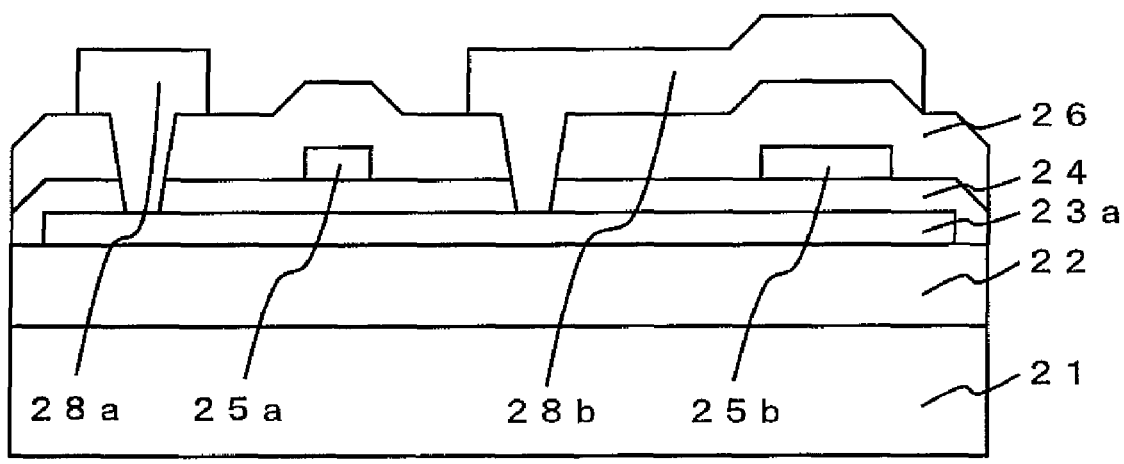
F I G. 1 3 (b)
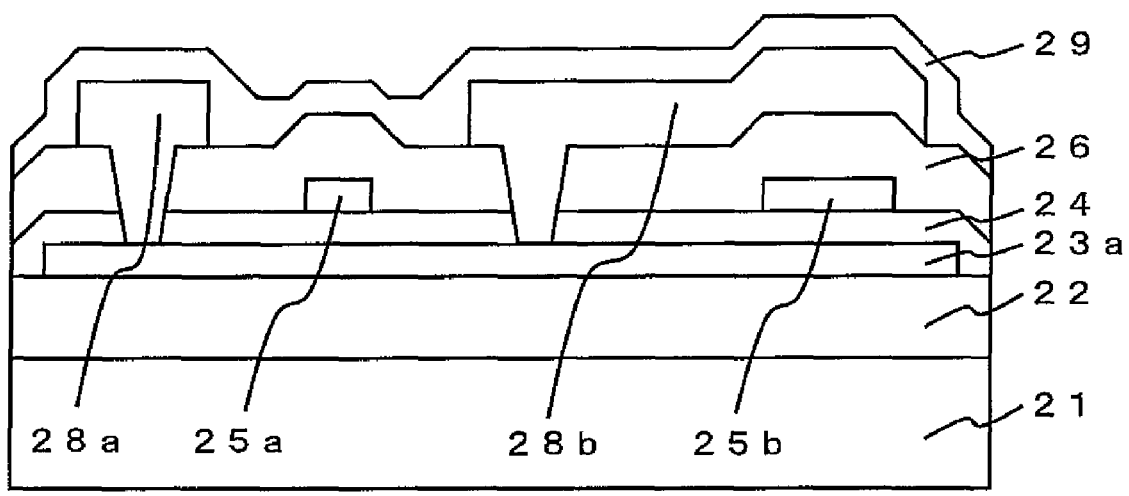

LIQUID CRYSTAL DISPLAY DEVICE AND DIELECTRIC FILM USABLE IN THE LIQUID CRYSTAL DISPLAY DEVICE

CROSS-REFERENCE TO RELATED APPLICATION

This application is a continuation application of U.S. application Ser. No. 11/583,882, filed Oct. 20, 2006 now U.S. Pat. No. 7,586,554, the contents of which are incorporated herein by reference.

BACKGROUND OF THE INVENTION

1. Field of the Invention

The present invention relates to a liquid crystal display device of active matrix mode driven by thin-film transistor and to a dielectric film usable in the liquid crystal display device.

2. Description of the Prior Art

Liquid crystal display device is widely used in applications as an image display device in various types of electronic devices such as thin-type television set, display for computer, portable terminal, etc. Most of the liquid crystal display devices are operated by a mode called active matrix mode. Specifically, there are provided thin-film transistor (TFT) to drive the liquid crystal for the pixels arranged in matrix form. As the types of TFT, amorphous silicon (a-Si; non-crystal silicon) TFT and polysilicon (poly-Si; polycrystal silicon) TFT are known.

The amorphous silicon TFT can be formed on a substrate with larger area at low cost, and this has been widely used in the liquid crystal display device since many years. On the other hand, the polysilicon TFT has higher operating speed than the amorphous silicon TFT and can be easily miniaturized, and it is suitable for the use in the liquid crystal display device operated at higher speed and for providing precise images. In recent years, with the propagation of high-performance liquid crystal display device, the demand on the polysilicon TFT has rapidly increased.

FIG. 1 is a circuit diagram of a conventional type liquid crystal display device of active matrix mode. In FIG. 1, a plurality of pixels 1 are arranged in matrix form on a substrate. In each of the pixels, there are provided a liquid crystal cell 3 with a pixel electrode 2, and a TFT 4 connected to the pixel electrode 2 and used for driving the liquid crystal cell. To a gate electrode of this TFT 4, a scan signal is supplied from a gate driver 5 via a gate wiring 6. To a source electrode of TFT 4, a data signal is sent from a source driver 7 via a source wiring 8.

In this way, the data signal is inputted to the pixel electrode 2 via TFT 4 selected by the scan signal. Each gate wiring 6 and each source wiring 8 are so arranged that these wirings are positioned around the pixel 1 to perpendicularly cross each other. Further, the drain electrode of TFT 4 is connected to the liquid crystal cell 3 and a storage capacitor 9, and a counter electrode of the storage capacitor 9 is connected to a common wiring 10. The storage capacitor 9 is used to maintain the voltage applied on the liquid crystal cell 3, and it is arranged in parallel to a liquid crystal capacitor by the liquid crystal cell 3.

FIG. 2 is a cross-sectional view to explain TFT structure in a conventional type liquid crystal display device of active matrix mode. In FIG. 2, a conventional type amorphous silicon TFT is shown as an example. In FIG. 2, a gate electrode 12 connected to the gate wiring 6 as explained in FIG. 1 is formed on a transparent substrate 11, for which glass is used as a suitable material, and a gate dielectric film 13 is formed to cover these components. A semiconductor film 14 is prepared on the gate electrode 12 to be superimposed on it, and a channel protective film 15 is prepared on the central portion.

In order that it is to be in contact with both ends of the channel protective layer 15 and with a part of the semiconductor film 14, an n+Si film is formed as a source electrode 16a and a drain electrode 16b, which are separated from each other on the channel protective film 15. On the source electrode 16, a metal film 17a is formed, which is to be turned to the source wiring 8 shown in FIG. 1. On the drain electrode 16b, a metal film 17b is formed, which connects the drain electrode 16b with the pixel electrode 2. Further, an interlayer dielectric film 18 is prepared to cover the source electrode 16a, the drain electrode 16b, and the metal films 17a and 17b. On the interlayer dielectric film 18, a transparent conductive film is formed, which is to be turned to the pixel electrode 2. This transparent conductive film is connected with the metal film 17b, which is connected with the drain electrode 16b via a contact hole 19 formed on the interlayer dielectric film 18 by patterning.

As described above, the interlayer dielectric film 18 is formed between the gate wiring 6 and the source wiring 8 on one side and the transparent conductive film on another side, which is to be turned to the pixel electrode 2. On the other hand, the pixel electrode 2 can be arranged to overlap on the gate wiring 6 and the source wiring 8. A structure as such is disclosed in the Patent Document 1, for instance. By such an arrangement, it is possible to improve the aperture ratio of the liquid crystal display device.

As the interlayer dielectric film 18, silicon nitride film (SiN; dielectric constant: approx. 8), silicon oxy-nitride (SiON; dielectric constant: approx. 4.5), and silicon oxide film (SiO; dielectric constant: approx. 4), etc. are known. These films are deposited by chemical vapor deposition (CVD) method. The film thickness is about 500 nm.

However, dielectric constant of these interlayer dielectric films have dielectric constant as high as 4 or more. This means that electric capacity between the pixel electrode 2 and the gate wiring 6 or the source wiring 8 is high, and this causes a problem. To solve this problem, a method is proposed, which uses a dielectric film with dielectric constant lower than that of the interlayer dielectric film as the interlayer dielectric film 18.

For instance, the Patent Document 2 describes a method, in which a SiOF film with fluorine added to a silicon oxide film (dielectric constant: approx. 3.5) or a SiCO film with carbon added on silicon oxide film (dielectric constant: approx. 3) is deposited by CVD method, and this is used as the interlayer dielectric film. By this method, electric capacitance generated on the interlayer dielectric film 18 can be reduced, and power consumption of the wirings of the liquid crystal display device can be decreased.

Another problem of the method to form the interlayer dielectric film 18 by CVD method is that the surface of the interlayer dielectric film 18 reflects surface irregularities of the underlying TFT. As a result, similar surface irregularities occur on the pixel electrode 2, which is prepared on the interlayer dielectric film 18, and this causes inadequate skip-over of the pixel electrode or poor orientation of the liquid crystal molecules. This results in the increase of pixel defects in TFT or poor image visibility.

To solve this problem, a method is proposed in the Patent Document 3. According to this method, chemical mechanical polishing (CMP) is applied for flattening after the interlayer dielectric film 18 has been thickly deposited, and the graded step in the underlying layer is eliminated. As another method for flattening, the Patent Document 4 discloses a method, by which a coating type film with low dielectric constant, e.g. hydro-silsesquioxane film (HSQ; dielectric constant: approx. 3) or methyl-silsesquioxane film (MSQ; dielectric constant: approx. 3), is used.

FIG. 3 is a cross-sectional view of TFT structure of the liquid crystal display device when the graded step in the underlying layer is flattened in the interlayer dielectric film 18 according to the conventional method as described above. The same functional component as in FIG. 2 is referred by the same symbol in FIG. 3. FIG. 3 shows that the interlayer dielectric film 18 has a flattened surface. As shown in FIG. 3, by using the interlayer dielectric film with low dielectric property and flatness, it is possible to reduce power consumption and defects of the liquid crystal display device and to improve image visibility.

On the other hand, when the interlayer dielectric film as given above is used, the number of processes to form the interlayer dielectric film 18 is increased, and this leads to the higher cost for the manufacture of the liquid crystal display device. That is, longer time is required for deposition of thick interlayer dielectric film by CVD method. Also, to carry out the CMP process on a substrate with large area, it is difficult to flatten uniformly. Further, the longer time is required for the process.

In case a coating type film with low dielectric constant is used, CMP process is not needed, while it is necessary to have complicated process to form the contact hole 19 for electrically connecting the pixel electrode 2 with the drain electrode 16b. In short, this means that a process is required, in which photo-patterning is performed by using photo-resist, and the pattern of the contact hole is transferred to the interlayer dielectric film 18 by etching. Further, the photo-resist must be peeled off, which is not needed any more.

To solve the problem of the increase of the number of processes to prepare the interlayer dielectric film 18, a method to use a photosensitive interlayer dielectric film is disclosed in the Patent Document 5. According to this method, by using photosensitive acrylic film (dielectric constant: approx. 3.5) as the interlayer dielectric film 18, there is no need to have the processes of etching and photo-resist peeling-off. This makes it possible to reduce the manufacturing cost of the liquid crystal display device.

However, the photosensitive acrylic film has a problem in that it has low heat-resistant property. Heat-resisting temperature of the photosensitive acrylic film is 250° C. or lower. In the process to manufacture the photosensitive acrylic film, after the processes of coating and photo-patterning, thermal curing is performed at the temperature of 200° C. to 250° C., and an interlayer dielectric film of 1.5-3 μm in thickness is obtained. Then, the pixel electrode and the orientation film are formed on the interlayer dielectric film. During this process, the temperature must be set to a value of 250° C. or lower.

When the photosensitive acrylic film is processed by heat treatment at the temperature higher than the heat-resisting temperature, it is easily colored, and this is not suitable as the interlayer dielectric film, which requires high optical transmissivity. Even when the heat treatment process is optimized so that coloring of the photosensitive acrylic film does not occur, optical transmissivity of the material of the photosensitive acrylic film is by about 5% to 10% lower than that of the CVD film of the siloxane type materials such as HSQ film or MSQ film as described above. When the optical transmissivity of the interlayer dielectric film is low, the transmissivity of the liquid crystal display device is also low. This means that image visibility is lower.

To solve the problem of low heat-resistant property or low optical transmissivity of the photosensitive acrylic film, the Patent Documents 6-8 disclose different methods to use photosensitive interlayer dielectric film. FIG. 4 is a flow chart to explain a process to prepare a conventional type dielectric film using poly-silazane. According to this method, a raw material solution containing poly-silazane and photosensitive compound is coated as the raw material of the dielectric film (Process 1; hereinafter referred as "P-1", and so on). Through the processes of prebaking (P-2), pattern exposure (P-3), development (P-4), overall exposure (P-5), humidification (P-6), and thermal curing (P-7), the siloxane dielectric film is prepared.

Here, in the processes of overall exposure (P-5), humidification (P-6), and thermal curing (P-7), silazane bonding (Si—NH—Si) is completely converted to siloxane bonding (Si—O—Si) via silanol (Si—OH).

The dielectric film thus obtained has heat-resistant property to temperature of 500° C. or more. When this is used as the interlayer dielectric film in the image display device, it has a property resistant enough to the processing temperature needed in the subsequent process after the process of the interlayer dielectric film. If organic silazane, which has organic group in side chain of poly-silazane, is used as raw material, organic siloxane dielectric film (dielectric constant: approx. 3) can be obtained, and low dielectric property can be attained.

The Patent Document 7 discloses a method to use inorganic poly-silazane having hydrogen group in side chain of poly-silazane as raw material. This material is turned to inorganic siloxane dielectric film (dielectric constant: approx. 4) after thermal curing. As a result, electric capacitance of the wirings increases compared with the case where organic siloxane dielectric film is used.

[Patent Document 1] JP-A-58-172685
[Patent Document 2] JP-A-2002-353465
[Patent Document 3] JP-A-2004-133239
[Patent Document 4] JP-A-2003-324201
[Patent Document 5] JP-A-2000-181069
[Patent Document 6] JP-A-2000-243834
[Patent Document 7] JP-A-2002-72504
[Patent Document 8] JP-A-2004-53838

SUMMARY OF THE INVENTION

Organic siloxane dielectric film obtained by using organic poly-silazane as raw material has low dielectric constant, high heat-resistant property and high optical transmissivity. Moreover, the number of the processes required for the deposition is low. Therefore, by using this as the interlayer dielectric film, a liquid crystal display device with low power consumption and with high image visibility can be manufactured at low cost. However, the organic siloxane dielectric film has another problem, i.e. the difficulty to produce it with higher thickness.

When it is tried to increase the film thickness of the organic siloxane dielectric film, film stress is generated due to the film contraction caused by "siloxanization" of silanol, and cracking occurs on a portion where stress is concentrated. In particular, in case there is a graded step in the underlying layer of the interlayer dielectric film, cracking is very likely to occur on or around the graded step. Moisture absorption of the interlayer dielectric film due to cracking may decrease the reliability of TFT or and may cause lower reliability of the liquid crystal display device. If film thickness cannot be increased, electric capacitance in the interlayer dielectric film increases in inverse proportion to the film thickness. Thus, even when an interlayer dielectric film with low dielectric constant may be used, it is difficult to reduce power consumption on the wirings. Further, if it is not possible to have high film thickness, the graded step in the underlying layer cannot be flattened as desired. As a result, it is difficult to eliminate the defects in pixels or to have higher image visibility.

The Patent Documents 5 and 8 as given above each describes a method to improve the cracking-limit thickness (the maximum film thickness not to cause cracking) by increasing carbon content in organic poly-silazane. More concretely, the content of organic group may be increased or number of carbons contained in the organic group may be increased (e.g. by adopting phenyl group having 6 carbon atoms instead of the methyl group, which has one carbon atom). By increasing the carbon content, the stress of the film can be reduced, and this leads to the improvement of the cracking-limit thickness. However, when carbon content in organic poly-silazane is increased, new problems may arise, e.g. heat-resistant property of organic siloxane dielectric film obtained after thermal curing may be decreased or optical transmissivity may be lowered.

As described above, the interlayer dielectric film with all properties suitable for the liquid crystal display device has not been known in the past, and the performance of the liquid crystal display device could not be maintained at high level.

It is an object of the present invention to provide a dielectric film, which has low dielectric constant, high heat-resistant property, high optical transmissivity, high film thickness, and high possibility for flattening and is produced at low cost, and this dielectric film can be applied for the liquid crystal display device, which has high image visibility and low power consumption and can be produced at low cost.

The above object can be attained by a liquid crystal display device, which comprises at least a substrate, a thin-film transistor, a conductive layer, and an interlayer dielectric film, wherein said interlayer dielectric film is an organic siloxane dielectric film containing silicon, oxygen, carbon, hydrogen and nitrogen, and a ratio of nitrogen content to silicon content (N content/Si content) in said interlayer dielectric film is 0.04 or more in element ratio. The insulating material according to the present invention can also be applied for the purpose other than the use in the interlayer dielectric film for the liquid crystal display device.

It is known that the organic siloxane dielectric film as described above contains silicon, oxygen, carbon and hydrogen. When it is so arranged that it also contains a slight amount of nitrogen, it is possible to solve the problem of the cracking caused by the thickening of the dielectric film. When organic siloxane dielectric film contains nitrogen, a slight amount of silazane bonding can be added to the organic siloxane dielectric film. By the presence of a slight amount of silazane bonding, stress in the film can be reduced, which develops as the result of film contraction due to "siloxanization", and cracking can be prevented. Naturally, it is essential that the characteristics of the film other than the stress of organic siloxane dielectric film (such as low dielectric property, heat-resistant property, resistance to moisture absorption, etc.) are not extensively reduced as the result of the presence of a slight amount of nitrogen in the film.

As the result of the studies by the inventors of the present application, it has been found that the ratio of N content/C content in organic siloxane dielectric film is preferably 0.04 or more, or more preferably 0.075 or more, or most preferably 0.1 or more, from the viewpoint of the effects to avoid cracking. On the other hand, in case nitrogen content is in excess, the effects to cause cracking are increased while moisture absorption of organic siloxane dielectric film increases. Thus, it is known that the ratio of N content/C content is preferably 0.5 or less, or more preferably 0.4 or less, or most preferably 0.3 or less.

Regarding the carbon content in the organic siloxane dielectric film, it has been found from the viewpoint of low dielectric property and higher flattening effect that the ratio of C content/Si content is preferably 0.01 or more, or more preferably 0.1 or more, or most preferably 0.5 or more. On the other hand, in case carbon content is in excess, heat-resistant property and optical transmissivity of the organic siloxane dielectric film are reduced. Thus, it has been found that the ratio of C content/Si content is preferably 2 or less, or more preferably 1.75 or less, or most preferably 1.5 or less.

Further, from the viewpoint of the reduction of electric capacitance and from the flattening of the graded step in the underlying layer, film thickness of the organic siloxane dielectric film is preferably 1.5 µm or more, or more preferably 2 µm or more, or most preferably 2.5 µm or more. If film is too thick, longer time is required for the manufacturing process (etching and photo-patterning of the interlayer dielectric film). Thus, it has been found that film thickness is preferably 5 µm or less, or more preferably 4 µm or less, or most preferably 3 µm or less.

As the organic group in the organic siloxane dielectric film, the following groups are suitable: alkyl group, phenyl group, vinyl group, alkylene group, phenylene group, vinylene group, etc. For the purpose of reducing the raw material cost for the organic siloxane dielectric film and of increasing chemical stability of the film after thermal curing, it is preferable, above all, to have a methyl group as the main organic group.

As the starting material of the organic siloxane dielectric film, it is preferable to use a raw material solution, which contains silicon polymer such as organic poly-siloxane, organic poly-silazane, etc. Further, it is preferable that the raw material solution contains a photosensitive compound. The raw material solution containing the silicon polymer and the photosensitive compound can be positive type or negative type coating material to be coated on the dielectric film. In case a contact hole is formed on the interlayer dielectric film, it is more preferable to use the positive type for the purpose of reducing the defect density. Therefore, it is preferable, above all, to use a combination of organic poly-silazane and photosensitive compound (e.g. photo-acid generator), which is more likely to add positive type photosensitive property.

Description will be given below on a method to prepare organic poly-siloxane dielectric film by using a raw material solution containing the organic poly-silazane and the photosensitive compound.

The raw material solution containing the organic poly-silazane and the photosensitive compound is coated on a substrate by a coating method such as roll coating, dip coating, bar coating, spin coating, spray coating, slit coating, etc. or by printing, and a coated film is prepared. Then, the coated film is processed by prebaking at the temperature of 40° C.-200° C. for a period of 10 seconds to about 30 minutes as required. In this case, there is no limitation to the type of the atmosphere, and the atmosphere can be selected from the atmospheric air, vapor, oxygen, or inert gas such as nitrogen, argon, etc. The film thickness of the coated film is so adjusted that it will be in the range of 1.5 µm to 5 µm (inclusive) after the final thermal curing.

Next, the coated film is processed by patterning according to the exposure method using a photo-mask or by direct exposure method. As the light source to be used for light exposure, high pressure mercury lamp, low pressure mercury lamp, metal halide lamp, xenon lamp, excimer laser, X-ray, electron beam, etc. may be used. Irradiation or exposure dose is normally in the range of 0.05 to 10000 mJ/cm$^2$.

In case the raw material solution contains a photo-acid generator as the photosensitive compound, acid is generated within the coated film due to the exposure to light, and silazane bonding (Si—NH—Si) is split or broken. Then, reaction with moisture in the atmosphere occurs. Silanol (Si—OH) bonding is generated, and organic poly-silazane is decomposed. In this case, if moisture is continuously supplied into the dielectric film, the acid contributed to the splitting of the silazane bonding of organic poly-silazane for once continues to fulfill the function as a catalyst for repeated splitting (chemical amplifying action). This "silanolization" of the silazane bonding also occurs during the exposure to light. This can be enhanced when the exposed coated film is processed by humidification. Normally, this humidification is performed at 15% RH to 90% RH and in the temperature range of about 15° C. to 100° C. and for about 30 seconds to 5 hours. The method of humidification may be the humidification by moisture in the room atmosphere or may be the enforced humidification using a humidifying device. Or, heating of the substrate by using hot plate or furnace may be combined in the process.

After the "silanolization" by the exposure to light, the coated film is developed by using alkali developer according to the developing procedure based on paddle development, dip development, shower development, etc. As a result, the exposed portion of the coated film is dissolved. Then, a non-exposed portion remains on the substrate, and a pattern is formed. Organic poly-silazane film on the non-exposed portion is not dissolved in alkali developing solution almost at all. The pattern of the projected light approximately agrees with the pattern of the dissolved organic poly-silazane, and the pattern can be obtained with high accuracy.

As the alkali developing solution, aqueous solution of tetra-methyl-ammonium hydroxide (TMAH), choline, sodium silicate, sodium hydroxide, potassium hydroxide, etc. may be used in concentration of about 0.1% to 10%. Developing time is normally in the range of about 0.1 to 10 minutes, and the developing temperature is normally in the range of about 15° C. to 90° C.

The coated film with the pattern after the development is converted to an organic siloxane dielectric film by performing thermal curing after rinsing with pure water. As a pre-treatment process before thermal curing, overall exposure and humidification may be carried out on the coated film with the pattern. On a region remaining as the pattern of the coated film (non-exposure region), the photo-acid generator remains. Therefore, if overall exposure and humidification are performed as the pre-treatment process before thermal curing on the coated film, similarly to the case of patterning of the coated film as explained above, acid is generated in the coated film due to the exposure. By catalytic action of this acid, silazane bonding of the organic poly-silazane is split, and "silanolization" is enhanced by humidification. Thus, organic poly-silazane after "silanolization" is easily converted to organic siloxane dielectric film with siloxane bonding (Si—O—Si) by thermal curing.

The overall exposure as the pre-treatment process before thermal curing may be performed within the range of exposure light source and exposure amount similar to those of the exposure of the patterning of the coated film as described above. In the overall exposure, it is preferable that the exposure is overall and unified exposure. If necessary, exposure may be performed only on the portion with the pattern or only on a part of the substrate.

Also, the humidification as the pre-treatment process of thermal curing may be carried out within the conditions similar to those of humidification during the patterning of the coated film as described above.

Finally, thermal curing process of the coated film is normally carried out in the range of about 200° C. to 1000° C. although it depends upon heat-resistant property of other materials such as substrate. In this case, there is no limitation to the type of the atmosphere, and the atmosphere may be selected from the atmospheric air, vapor, oxygen, or insert gas such as nitrogen, argon, etc.

In the present invention, it is important that nitrogen content in the organic poly-silazane after thermal curing can be controlled by adjusting the conditions of overall exposure and humidification as the pre-treatment process before thermal curing, and the conditions of thermal curing. If the ratio of N content/Si content can be set to 0.04 or more as required in the present invention, the extent of overall exposure, humidification and thermal curing may be reduced more compared with the practice in the past and "siloxanization" may be avoided.

FIG. 5 is a flow chart to explain a process for forming the dielectric film using poly-silazane as the starting material according to the present invention. In FIG. 5, the process to coat the raw material solution containing poly-silazane and photosensitive compound as the raw materials of the dielectric film (P-11) and the processes of prebaking (P-12), pattern exposure (P-13), and development (P-14) are the same as those shown in FIG. 4. According to the present invention, siloxane dielectric film can be obtained without overall exposure, or by reducing the irradiation amount of overall exposure (P-15) and without humidification process, or by decreasing the humidity, the temperature and the time of humidification process (P-16) and by decreasing the temperature and the time of thermal curing and by reducing the vapor in the atmosphere (P-17).

As described above, for the purpose of increasing the nitrogen content compared with the case in the past, it may be so arranged that overall exposure is not used or irradiation amount or exposure dose of overall exposure is reduced, or humidification process is not used or humidity, temperature and time of humidification are reduced, or temperature and time of thermal curing and vapor in the atmosphere may be reduced. However, such control of conditions must be carried out within such a range that the ratio of N content/Si content does not exceed the upper limit, (i.e. 0.5) in the present invention. More concretely, in case some of the parameters as given above are reduced and the ratio of N content/Si content exceeds 0.5, the ratio of N content/Si content can be reduced to 0.5 or less by increasing the other parameters. By adequately combining the conditions of overall exposure, humidification and thermal curing, it is possible to obtain organic siloxane dielectric film according to the present invention with the nitrogen content adjusted.

As described above, when the organic siloxane dielectric film with low dielectric constant, high flattening effect, low cost, high heat-resistant property, high optical transmissivity and high film thickness is used as the interlayer dielectric film, it is possible to provide the liquid crystal display device with low power consumption and with high image visibility at low cost. This dielectric film may be used in an image display device of active matrix mode other than liquid crystal display device or as an insulating layer in electronic device other than the image display device.

According to the present invention, it is possible to provide a dielectric film which has low dielectric constant, high heat-resistant property, high optical transmissivity, high film thickness and high flattening effect and not causing cracking at low cost. By using this dielectric film as an interlayer dielectric film for an image display device of active matrix mode, a liquid crystal display device with low power consumption and high image visibility can be manufactured at low cost.

As the effects when this is applied in the liquid crystal display device, electric capacitance of the wirings can be reduced due to the effects of high film thickness and low dielectric constant, and it is possible to reduce power consumption of the wirings and power consumption of the liquid crystal display device. In particular, in the liquid crystal display device such as thin-type television set, length of wiring on the thin-film transistor substrate is very long, and this contributes to the increase of the effect to reduce power consumption. As a result, the number of driver ICs can be reduced, and this contributes to cost reduction.

Also, the dielectric film of the present invention has high heat-resistant property, and this means that quality deterioration does not occur even when high temperature is applied in the processes after the formation of the dielectric film. As a result, when it is used as the interlayer dielectric film of a liquid crystal display device, for instance, resistance can be reduced by performing high-temperature annealing on transparent conductive film on upper layer of the interlayer dielectric film, and this is helpful in achieving low power consumption and high performance operation of the liquid crystal display device. Also, the dielectric film of the present invention has high optical transmissivity, and the backlight of the liquid crystal display device can pass through it efficiently. This increases image visibility of the liquid crystal display device and power consumption can be decreased.

In case the dielectric film of the present invention is prepared by the coating method as the interlayer dielectric film of the liquid crystal display device, the graded step in the underlying layer of the interlayer dielectric film can be efficiently flattened. As a result, the pixel electrode can be easily flattened, and this prevents poor orientation of liquid crystal molecules.

Also, in case the dielectric film of the present invention is prepared by raw material solution with photosensitive property, the processes of photo-patterning of resist and etching process of the dielectric film can be eliminated. When it is used as the interlayer dielectric film of the liquid crystal display device, it is possible to reduce the number of processes, the processing cost and the material cost of the liquid crystal display device.

The present invention can be used in wide applications such as thin-film transistor (TFT) or other component elements of the liquid crystal display device regardless of the type of the component elements and of display mode of the liquid crystal display device. For example, amorphous silicon TFT, low temperature polysilicon TFT, high temperature polysilicon TFT, pseudo-single crystal silicon TFT, single crystal silicon TFT, non-silicon TFT (such as organic TFT), etc. may be used as TFT. Further, the thin-film transistor may be of top gate type or of bottom gate type.

As the substrate, glass substrate, quartz substrate, plastic resin substrate, etc. may be used.

As the conductive film used in the wirings or pixel electrode in the liquid crystal display device, aluminum, copper, titanium, tantalum, tungsten, molybdenum, silicon, etc. may be used alone or as alloy of these elements. If it is necessary that the conductive film is transparent, transparent conductive film using ITO (indium tin oxide), ZnO (zinc oxide), SnO (tin oxide), CdSnO (cadmium tin oxide) or organic polymer may be used.

As electric field type to drive liquid crystal of liquid crystal display device, both the longitudinal electric field type and lateral electric field type may be used. Therefore, various modes of liquid crystal driving such as VA (Vertical Align) mode or IPS (In-Plane-Switching) mode may be used.

Also, as display mode of liquid crystal display device, any of transmission type, semi-transmission type or reflection type may be used.

The dielectric film of the present invention exhibits high effects when it is applied as interlayer dielectric film of the liquid crystal display device, while it can also be applied in image display device other than liquid crystal display device, e.g. organic EL display, field emission display (FED), etc.

BRIEF DESCRIPTION OF THE DRAWINGS

FIG. 3 is a cross-sectional view of TFT structure of a liquid crystal display device in case the graded step in the underlying layer is flattened in an interlayer dielectric film 18 according to the conventional method;

FIG. 6 is a diagram to show a relation between cracking-limit thickness and a ratio of N content/Si content of the organic siloxane dielectric film obtained according to the present invention;

FIG. 7 is a dielectric diagram to show a relation between dielectric constant and a ratio of N content/Si content of the organic siloxane dielectric film according to the present invention;

FIG. 12 represents drawings similar to FIG. 11, each to explain a process for forming low temperature polysilicon TFT on a thin-film transistor substrate of the liquid crystal display device of active matrix mode;

FIG. 13 represents drawings similar to FIG. 12, each to explain a process for forming low temperature polysilicon TFT on a thin-film transistor substrate of the liquid crystal display device of active matrix mode;

BEST MODE FOR CARRYING OUT THE INVENTION

Detailed description will be given below on the present invention referring to embodiments, while the present invention can be used in various applications without being limited by these embodiments.

Example 1

Example 1 of the present invention relates to a method for forming a dielectric film suitable as an interlayer dielectric film of a liquid crystal display device and to a dielectric film obtained by the method. As the starting material for the dielectric film of Example 1, organic poly-silazane, which has a methyl group as an organic group and has a ratio of silicon content to carbon content (C content/Si content) being 1 in the element ratio is used, and a raw material solution, which contains a photo-acid generator diluted by propylene-glycol-monomethyl ether acetate (PGMEA) is used. This raw material solution was processed by spin coating at 500-3000 rpm on a silicon substrate or on glass substrate, and prebaking was performed using hot plate in nitrogen atmosphere at 90° C. for 90 seconds. The coated film thus obtained was processed by overall exposure, humidification, and thermal curing in this order under the condition shown in Table 1. For the overall exposure, a low pressure mercury lamp was used. For thermal curing, hot plate was used. Table 1 shows film depositing conditions of each sample, and element ratio of nitrogen content to silicon content (N content/Si content) in organic siloxane dielectric film obtained.

The ratio of Ni content/Si content was determined by X-ray photoelectron spectrometry (XPS). The ratio of C content/Si content of organic siloxane dielectric film measured by XPS was 1 in each of the Example 1-11, and this was equal to the ratio of C content/Si content of organic poly-silazane used as the starting material.

FIG. 6 is a diagram to show cracking-limit thickness and the ratio of N content/Si content of organic siloxane dielectric film according to the present invention. As it is evident from FIG. 6, when the ratio of N content/Si content was increased to 0.04 or more from the conventional value of 0.01, the cracking-limit thickness was improved from 1.2 μm as known in the past to 1.5 μm or more.

Figure 1:
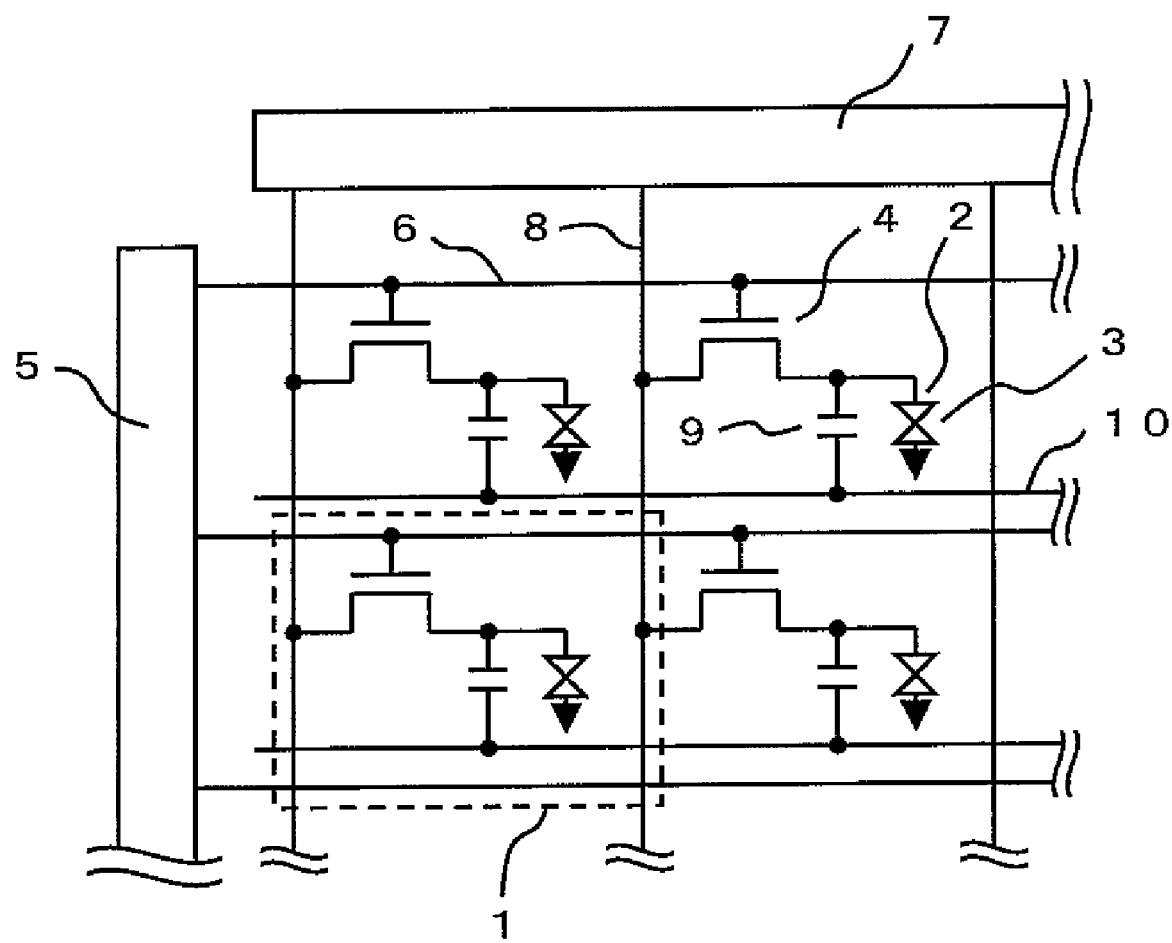
FIG. 1 is a circuit diagram of a conventional type liquid crystal display device of active matrix mode.
Figure 2:
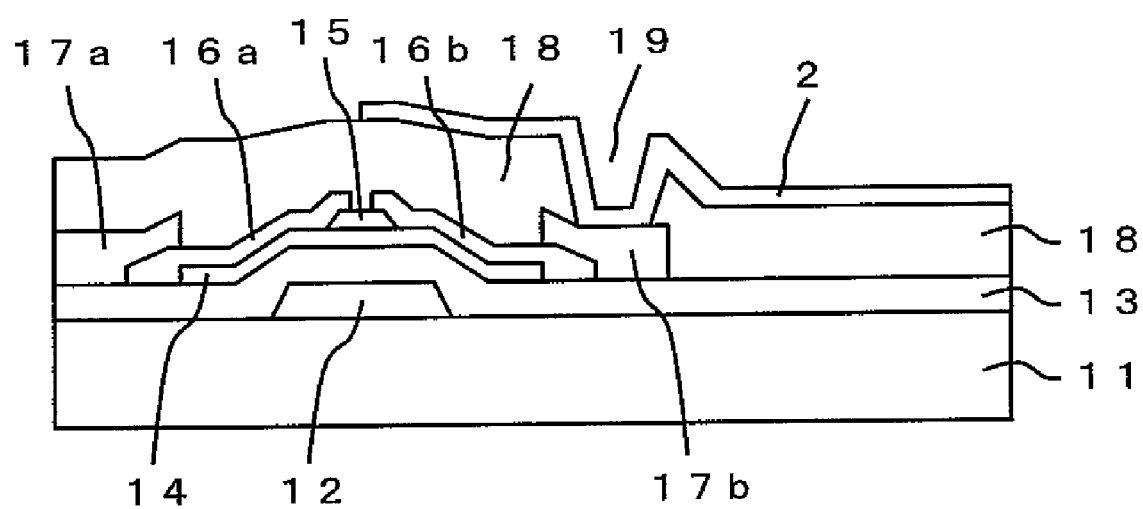
FIG. 2 is a cross-sectional view to explain TFT structure in the conventional type liquid crystal display device of active matrix mode.
Figure 4:
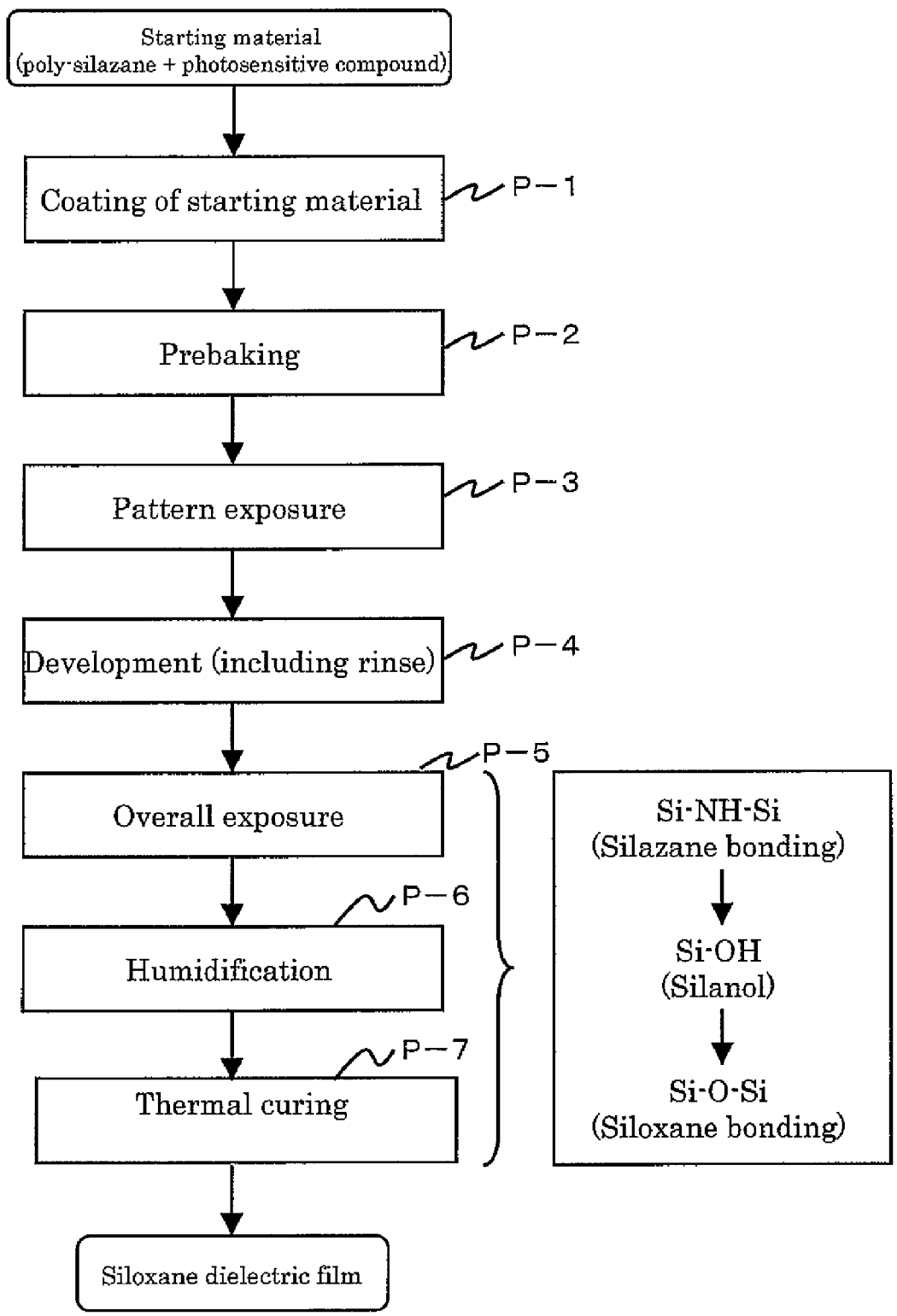
FIG. 4 is a flow chart to explain a process for forming a conventional type dielectric film using poly-silazane.
Figure 5:
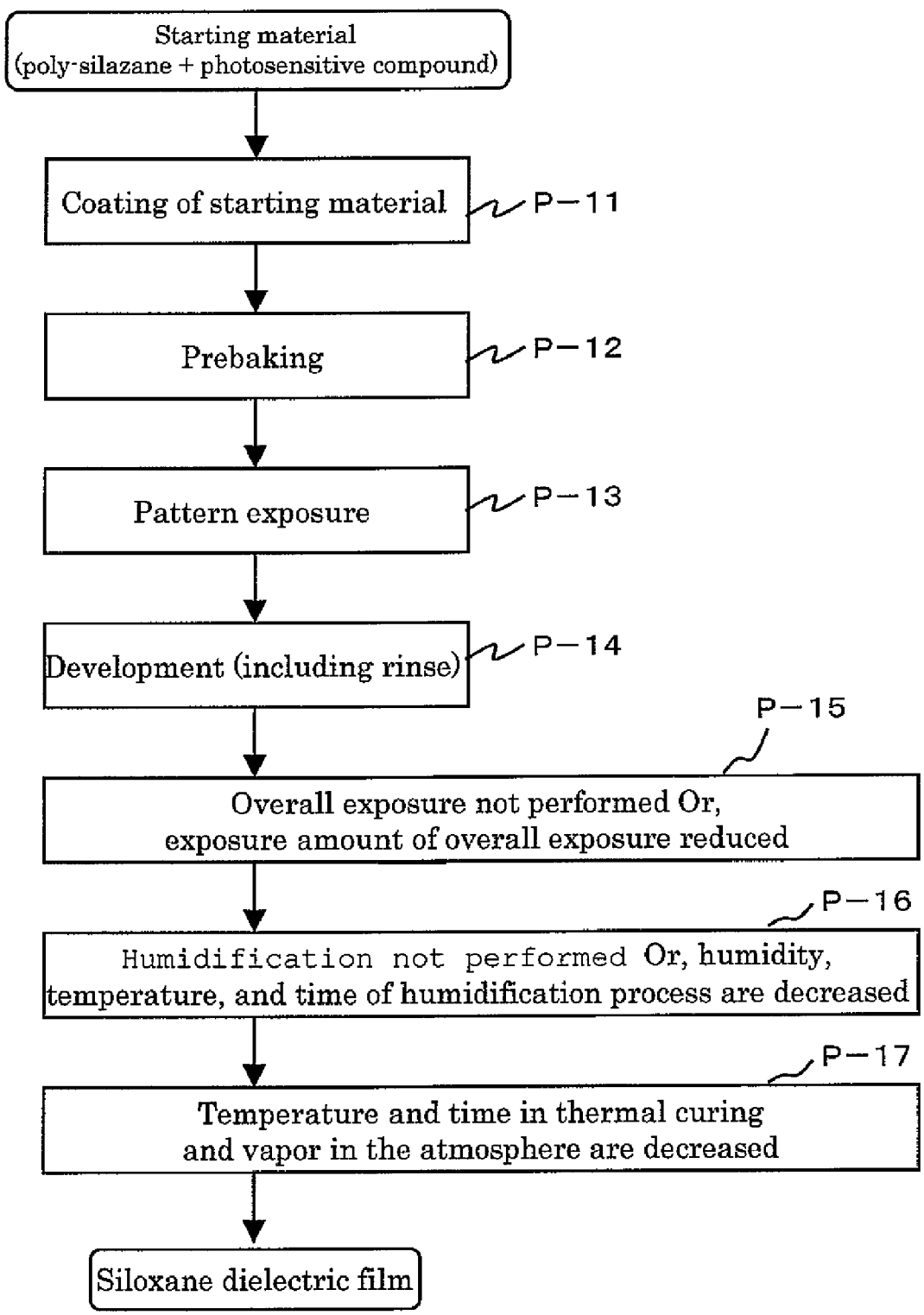
FIG. 5 is a flow chart to explain a process for forming a dielectric film using poly-silazane as a starting material according to the present invention.
Figure 8:
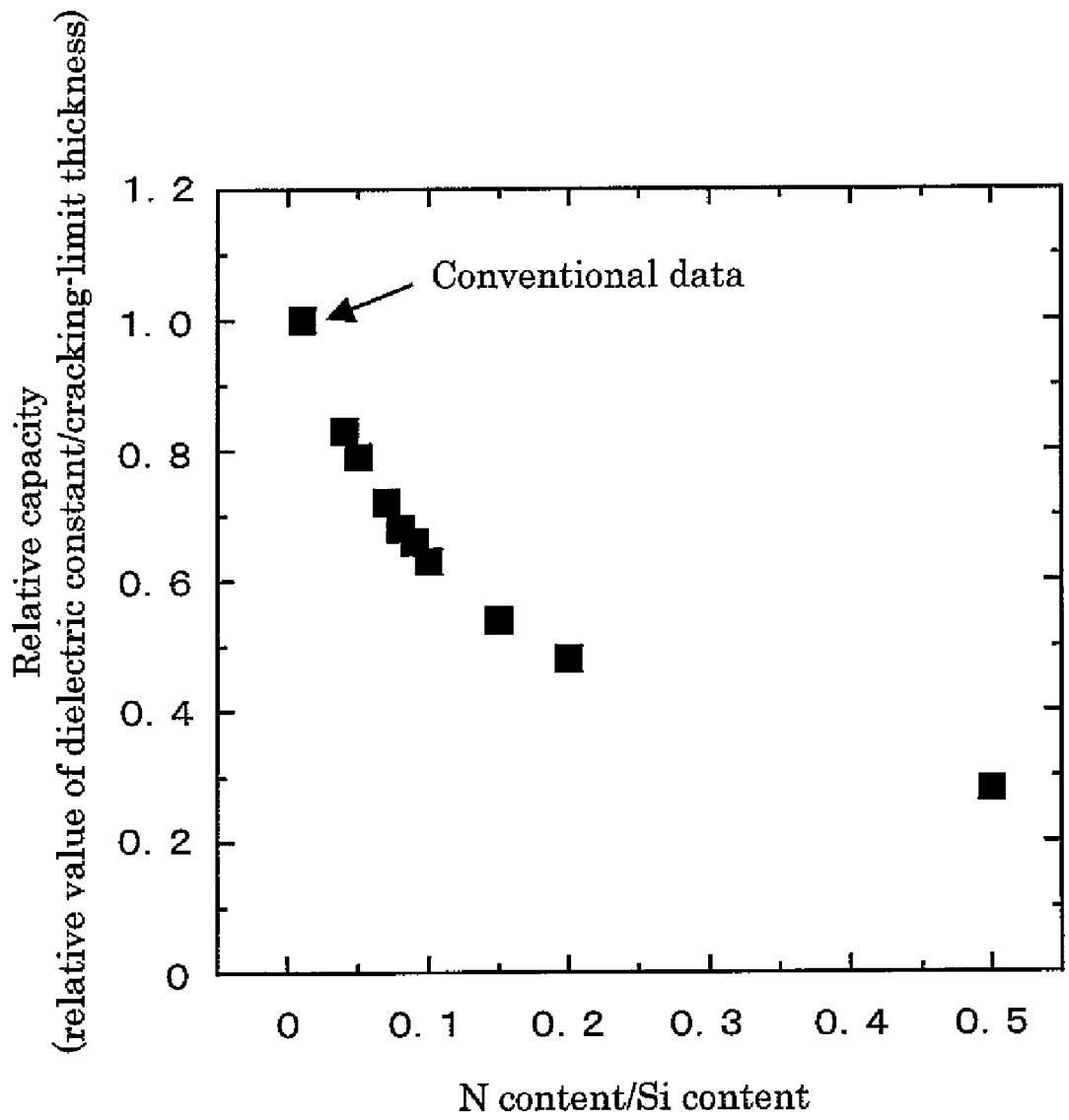
FIG. 8 is a diagram to show a relation between relative capacity and a ratio of N content/Si content of the organic siloxane dielectric film according to the present invention.

FIG. 7 is a diagram to show the relation between dielectric constant and the ratio of N content/Si content of organic siloxane dielectric film according to the present invention. FIG. 8 is a diagram to show the relation between relative capacity and the ratio of N content/Si content of the organic siloxane dielectric film according to the present invention. The relative capacity of FIG. 8 is calculated as relative value of dielectric constant/cracking-limit thickness.

As it is evident from FIG. 7, when the value of N content/Si content is increased for the purpose of improving the cracking-limit thickness, dielectric constant is increased. However, as it is seen in FIG. 8, relative capacity (relative value of dielectric constant/cracking-limit thickness) of the interlayer dielectric film decreases with the increase of the value of N content/Si content. This suggests that there is no problem in the increase of dielectric constant.

Next, the efficiency of flattening of the graded step in the underlying layer in each of Samples 1-11 shown in Table 1 was evaluated as follows: Each sample was coated in the cracking-limit thickness on isolated graded step of 500 nm×2

TABLE 1

| | Overall exposure Irradiation amount (mJ/cm$^2$) | Humidification | | | Thermal curing | | | |
| --- | --- | --- | --- | --- | --- | --- | --- | --- |
| | | Humidity (% RH) | Temperature (° C.) | Time (min.) | Atmosphere | Temperature (° C.) | Time (min.) | N content/Si content |
| Sample 1 | 100 | 80 | 25 | 5 | Atmospheric air | 400 | 30 | 0.01 |
| Sample 2 | 50 | 40 | 25 | 5 | Atmospheric air | 400 | 30 | 0.04 |
| Sample 3 | 50 | 40 | 20 | 5 | Atmospheric air | 400 | 30 | 0.05 |
| Sample 4 | 50 | 40 | 20 | 1 | Atmospheric air | 400 | 30 | 0.07 |
| Sample 5 | 50 | — | — | — | Atmospheric air | 400 | 30 | 0.08 |
| Sample 6 | — | — | — | — | Atmospheric air | 400 | 30 | 0.09 |
| Sample 7 | — | — | — | — | Nitrogen | 400 | 30 | 0.1 |
| Sample 8 | — | — | — | — | Nitrogen | 300 | 30 | 0.15 |
| Sample 9 | — | — | — | — | Nitrogen | 250 | 30 | 0.2 |
| Sample 10 | — | — | — | — | Nitrogen | 200 | 15 | 0.5 |
| Sample 11 | — | — | — | — | Atmospheric air | 150 | 15 | 0.45 |
| Sample 12 | — | — | — | — | Nitrogen | 150 | 15 | 0.6 |

Example 1 in Table 1 is an example, for which overall exposure, humidification, and thermal curing were performed to full extent according to the conventional method, and nitrogen content in the film was extensively reduced. Also, Samples 2-11 are the examples, in which optimal nitrogen content was attained by controlling the conditions of overall exposure, humidification, and thermal curing according to the present invention.

μm×1 mm (height×width×depth). It was assumed that film thickness of the thickest portion of organic siloxane dielectric film after thermal curing was X nm and the thickness of the thinnest portion (isolated graded step) was Y nm, and the flattening efficiency was calculated as: 100×[X/(Y+500)]%. As a result, the flattening efficiency was about 70% in Sample 1 with small film thickness, while it was in the range of about 80%-100% in Samples 2-11, which had greater thickness.

When heat-resistant property of each of Samples 1-11 was evaluated (evaluated according to fluctuation of dielectric constant), dielectric constant increased to 500° C. in none of these samples. Further, when optical transmissivity of each of Samples 1-11 was determined at a wavelength of 400 nm, each of the samples showed a value as high as 98% or more.

The ratio of N content/Si content in each of Samples 1-11 was controlled to 0.5 at the maximum. Evaluation was made on the effects when the ratio of N content/Si content exceeded 0.5. Organic poly-silazane similar to the material of Samples 1-11 was used as the starting material. Overall exposure and humidification were not performed. Sample 12 was prepared as comparative example by eliminating overall exposure and humidification and was processed by thermal curing at 150° C. for 15 minutes. As a result, moisture resistance of Sample 12 was lower than that of Samples 1-11. Specifically, when Samples 1-12 were left to stand for a week in an atmosphere with humidity of 40% RH and 25° C. in temperature, dielectric constant of Samples 1-10 increased in an extent of 10% or less, while dielectric constant of Sample 12 increased by 25% or more.

As described above, it was found that moisture resistance decreased when the ratio of N content/Si content increased to 0.5 or more. In order to avoid the increase of the ratio of N content/Si content to 0.5 or more when the processes of overall exposure and humidification were not performed, thermal curing may be carried out in the atmospheric air (Sample 11) or the temperature of thermal curing may be set to 200° C. or more (Samples 5-7).

In the above experiments, carbon content of organic siloxane dielectric film was set to a constant value (C content/Si content=1). Then, experiment was performed by changing carbon content. Specifically, the ratio of C content/Si content was varied from 0.01 to 4 under the same film depositing condition as in Sample 8. As a result, with the increase of the ratio of C content/Si content, dielectric constant decreased, and the flattening efficiency was improved. On the other hand, optical transmissivity and heat-resistant property at a wavelength of 400 nm decreased. More concretely, when the ratio of C content/Si content was more than 2, optical transmissivity decreased to 90% or lower, and heat-resistant property decreased to 400° C. or lower. Also, when the ratio of C content/Si content was 0, dielectric constant after thermal curing was as high as 4.2, and the flattening efficiency was as low as 70%. Therefore, it was found that the range of the ratio of C content/Si content is preferably in the range of 0.01 to 2 (inclusive).

Example 2

Figure 9:
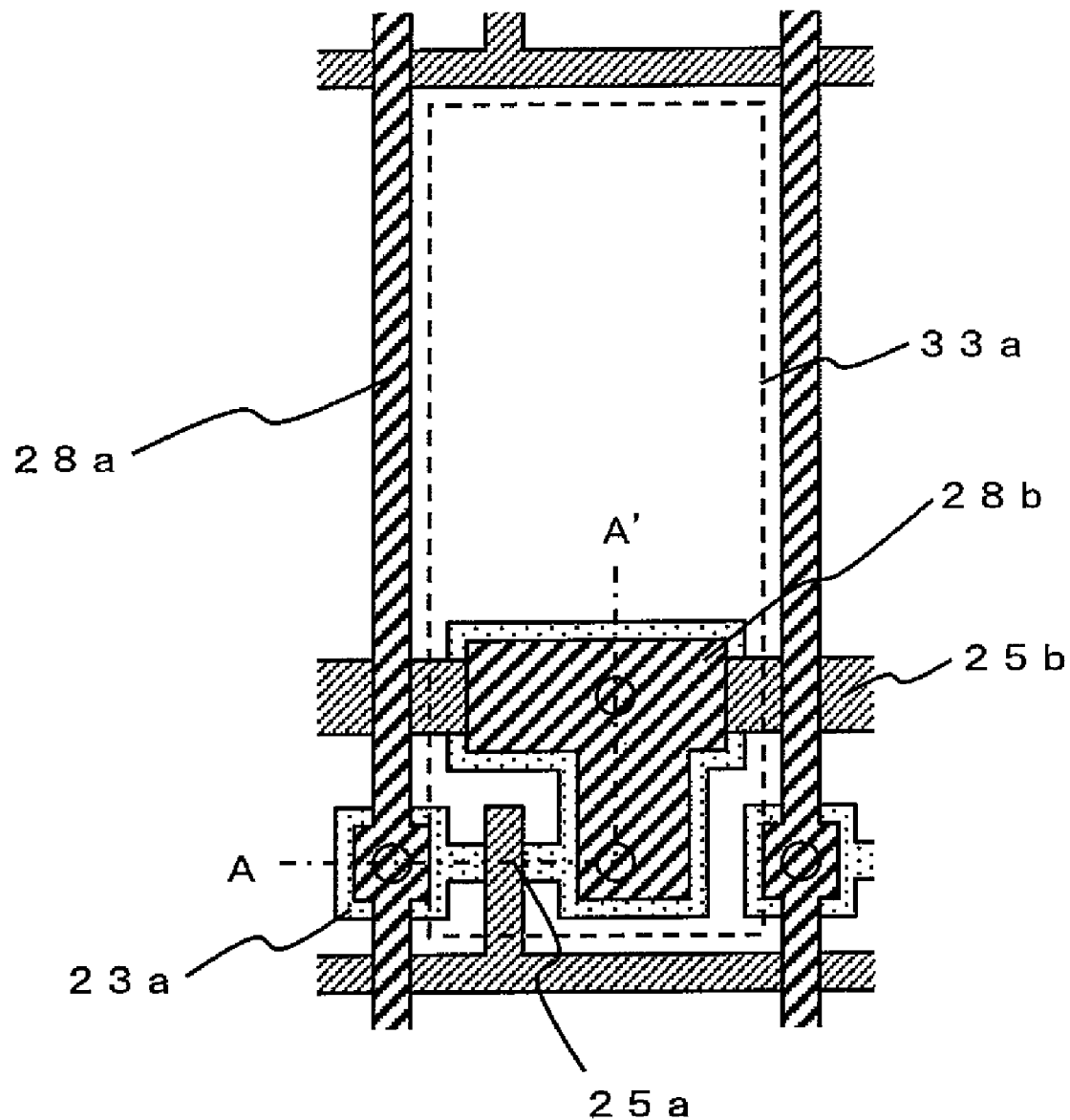
FIG. 9 is a plan view to show one pixel unit of TFT in the liquid crystal display device according to the present invention.
Figure 10:
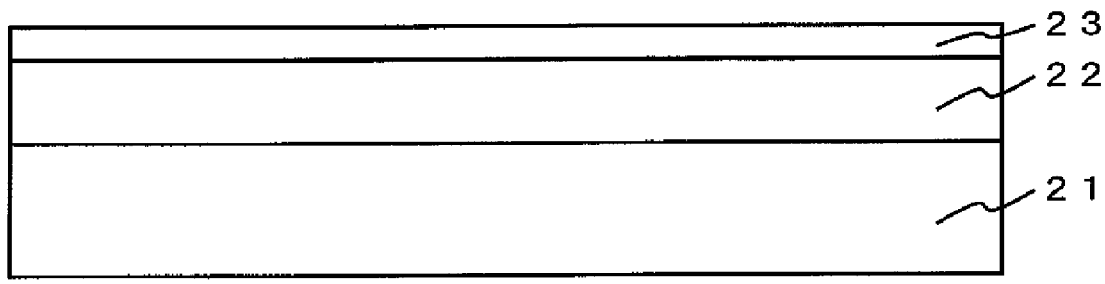
FIG. 10 represents drawings each to explain a process for forming low temperature poly-silicon TFT on a thin-film transistor substrate of the liquid crystal display device of active matrix mode.
Figure 10:
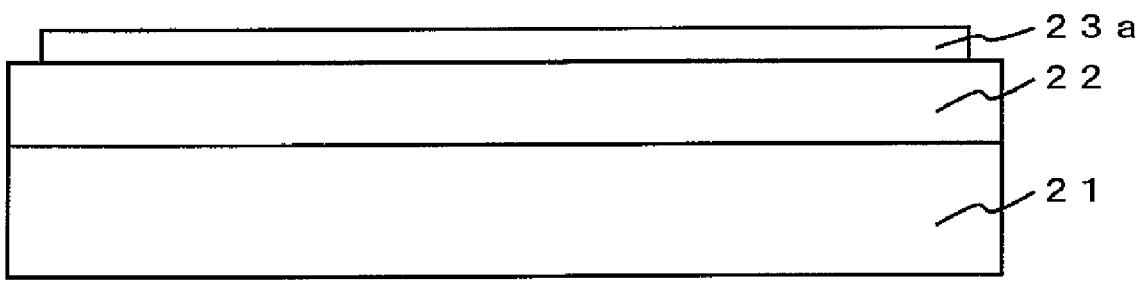
Figure 10:
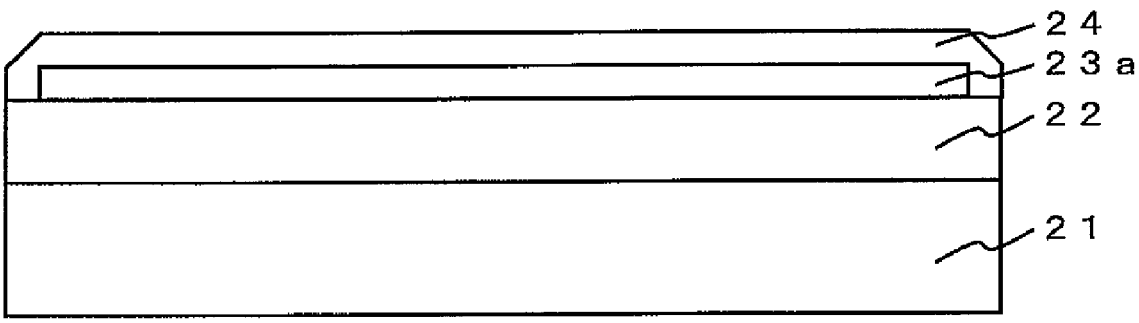
Figure 11:
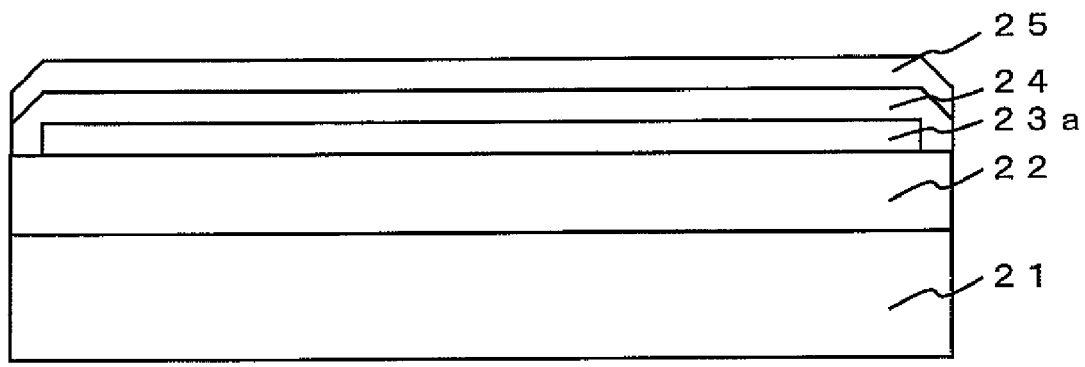
FIG. 11 represents drawings similar to FIG. 10, each to explain a process for forming low temperature polysilicon TFT on a thin-film transistor substrate of the liquid crystal display device of active matrix mode.
Figure 11:
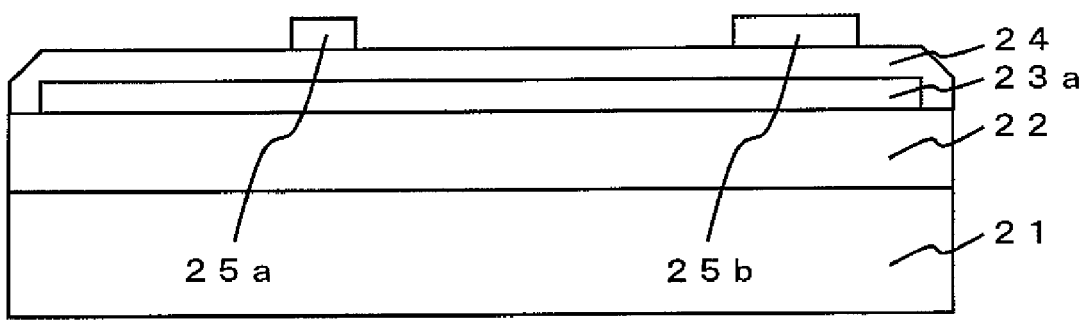
Figure 11:
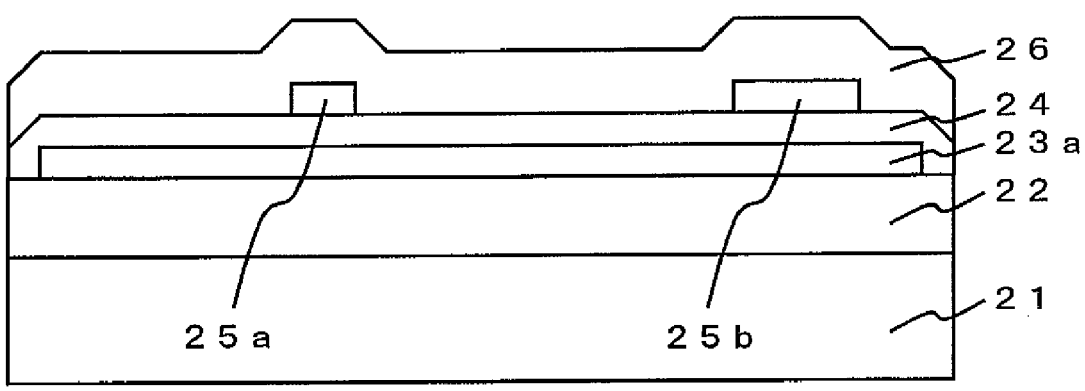

Example 2 relates to the liquid crystal display device of the present invention. In this Example 2, a process to form low temperature polysilicon TFT was taken as an example. FIG. 9 is a plan view of one pixel unit of TFT in the liquid crystal display device of the present invention. In the pixel, there are provided TFT comprising a polysilicon film 23a, a gate electrode 25a, a source wiring 28a, and a drain wiring 28b, and a capacity electrode 25b. Also, a pixel electrode 33a and the drain wiring 28b are superimposed on each other with the interlayer dielectric film interposed therebetween. FIG. 15 represents cross-sectional views, each showing TFT in the liquid crystal display device of the present invention along the line A-A' in FIG. 9.

FIG. 10-FIG. 15 each represents drawings to explain a process for forming low temperature polysilicon TFT on the thin-film transistor substrate of the liquid crystal display device of active matrix mode. Description will be given below on the process to form low temperature polysilicon TFT on a glass substrate by referring to FIG. 10 to FIG. 15. On a glass substrate 21 comprising alkali-free glass with liquid crystal display strain point of 670° C., a silicon nitride film of 150 nm and a silicon oxide film of 100 nm were deposited by plasma CVD method as an under-layer dielectric film 22. Further, amorphous silicon film 23 was deposited in thickness of 50 nm by plasma CVD method (FIG. 10a).

Next, the amorphous silicon film 23 was crystallized by irradiating XeCl excimer laser. By performing photo-patterning process and the etching process as already known, a polysilicon film 23a in island-like shape was prepared (FIG. 10b).

Then, a gate dielectric film 24 comprising silicon oxide film was deposited in thickness of 100 nm by plasma CVD method (FIG. 10c). Further, Al film was deposited in thickness of 200 nm as a first metal film 25 by the sputtering method (FIG. 11a). Subsequently, patterning was performed on the first metal film 25 by photo-patterning and etching process, and a gate electrode 25a and a capacity electrode 25b were prepared (FIG. 11b).

In the processes as given above, impurities such as phosphorus, boron, etc. may be injected as necessary to a part of the polysilicon 23a. The injection of the impurities is carried out by the photo-patterning and the ion injection process as already known. Also, if necessary, the impurities may be activated by heating the substrate. Then, to cover the gate electrode 25a and the capacity electrode 25b, a first dielectric film 26 comprising CVD silicon oxide film was deposited in thickness of about 500 nm (FIG. 11c).

Next, by the photo-patterning and the etching process as already known, contact holes 27a and 27b were formed on the gate dielectric film 24 and on the first interlayer dielectric film 26 (FIG. 12a). Then, a second metal film 28 comprising 5-layer metal film, which contains Ti/TiN/Al/TiN/Ti, was deposited in total thickness of 500 nm by the sputtering method (FIG. 12b).

Further, the second metal film 28 was processed by the photo-patterning and the etching process already known, and a source wiring 28a and a drain wiring 28b were prepared (FIG. 13a). Subsequently, a protective dielectric film 29 of 200 nm in thickness comprising CVD silicon nitride film was deposited to cover the whole area (FIG. 13b).

Figure 14A:
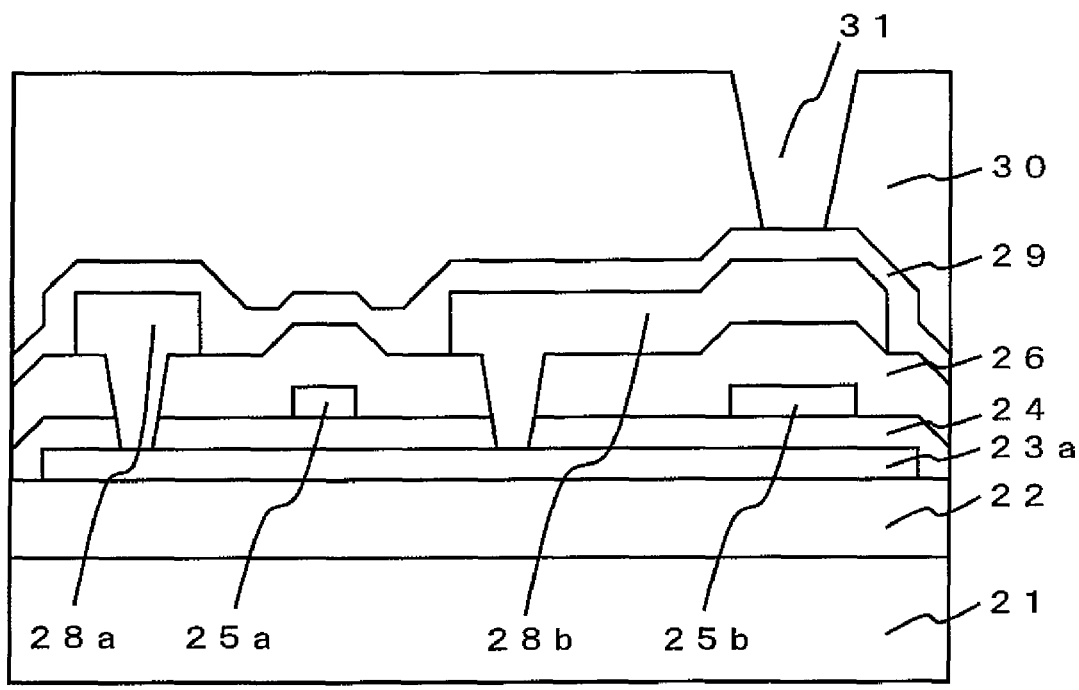
FIG. 14 represents drawings similar to FIG. 13, each to explain a process for forming low temperature polysilicon TFT on a thin-film transistor substrate of the liquid crystal display device of active matrix mode.

Using the substrate comprising TFT, wirings and dielectric films prepared as described above as the underlying layer, a second interlayer dielectric film 30 comprising organic siloxane dielectric film was deposited (FIG. 14a). Concrete depositing method of the interlayer dielectric film 30 was as follows: Organic polysilazane containing a methyl group as organic group and with the ratio of nitrogen content to carbon content (C content/Si content) of 1 in the element ratio was diluted together with a photo-acid generator by propyleneglycol-monomethyl ether acetate (PGMEA), and this was used as the raw material solution. This raw material solution was coated on the substrate by spin coating at 800 rpm, and prebaking was performed by using hot plate in nitrogen atmosphere at 90° C. for 90 seconds.

Then, using a photo-mask, pattern exposure of 100 mJ/cm$^2$ was performed only on a portion where a hole pattern 31 is to be formed using a low pressure mercury lamp. Subsequently, humidification process was carried out at 80% RH and at 25° C. for 3 minutes. This humidification exerts action only on a portion corresponding to the hole pattern 31 processed by mask exposure. Next, development was conducted with 2.38% TMAH developer for 2 minutes and by rinsing with pure water for 5 minutes, and the hole pattern 31 was obtained. Subsequently, thermal curing was promptly carried out at 300° C. for 30 minutes in nitrogen atmosphere without performing overall exposure and humidification. As a result, a second interlayer dielectric film 30 comprising the organic siloxane dielectric film and the hole pattern 31 formed on it as shown in FIG. 13*a* were prepared. The film thickness of the second interlayer dielectric film 30 was about 2.3 μm.

Figure 14B:
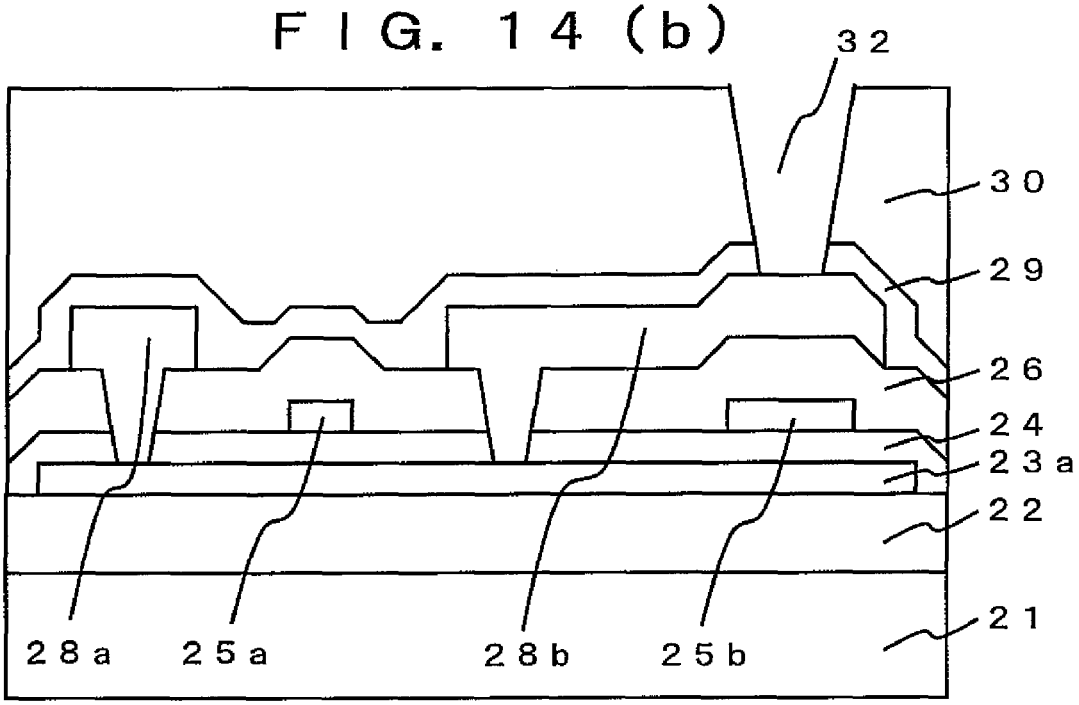
Figure 15A:
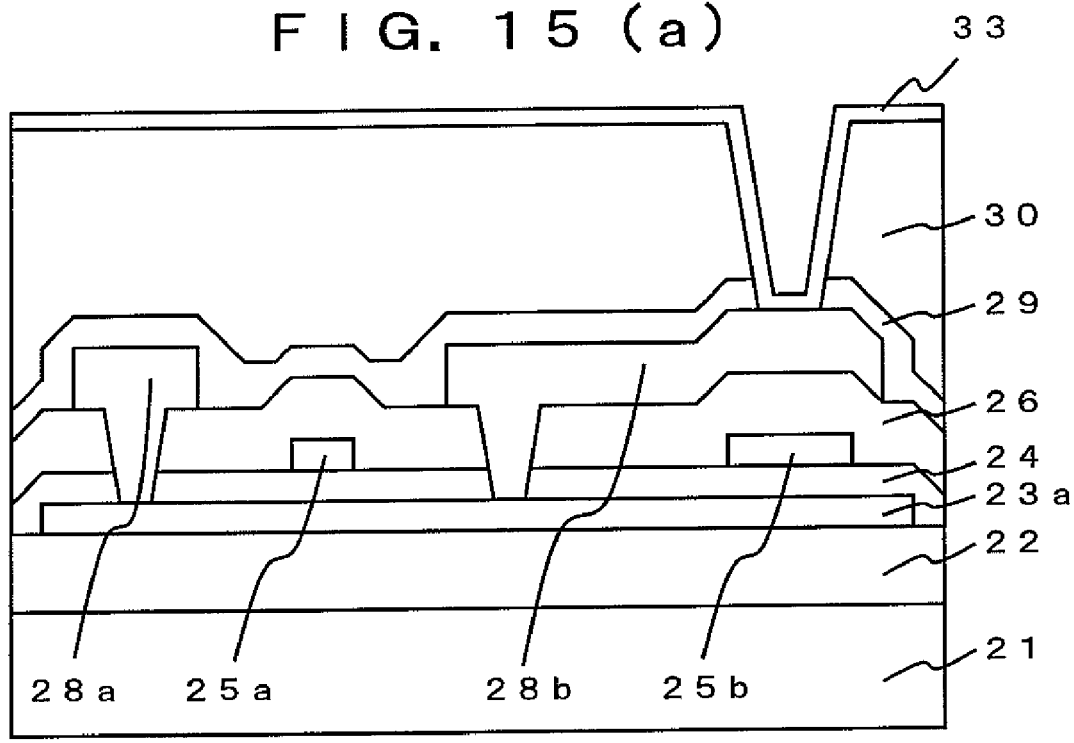
FIG. 15 represents drawings similar to FIG. 14, each to explain a process for forming low temperature polysilicon TFT on a thin-film transistor substrate of the liquid crystal display device of active matrix mode.
Figure 15B:
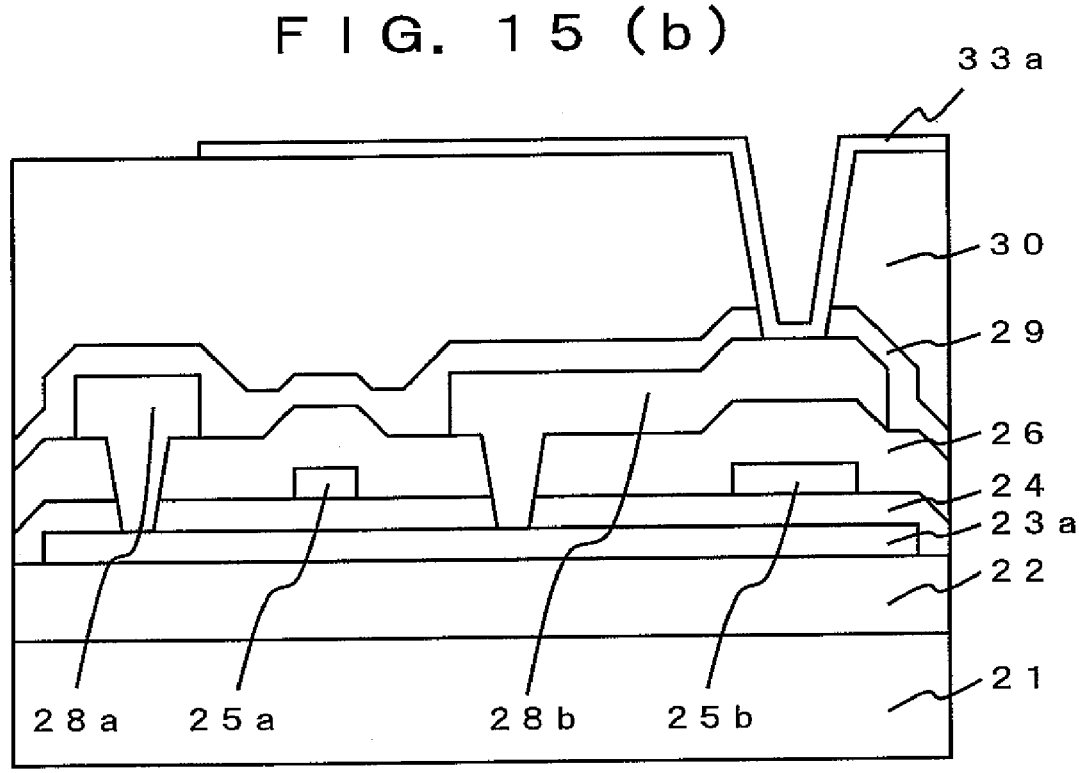

Then, using the second interlayer dielectric film 30 as a mask, the protective dielectric film 29 was processed by the etching method already known, and the content hole 32 was formed (FIG. 14*b*). Further, on the second interlayer dielectric film 30, a transparent conductive film 33 made of ITO film was prepared by the sputtering method so that connection is made to the drain wiring 28*b* via the contact hole 32 (FIG. 15*a*). The transparent conductive film 33 is processed to a pixel electrode 33*a* by the photo-patterning and etching process as already known (FIG. 15*b*).

Using the low temperature polysilicon TFT prepared as described above, and further by performing the processes to manufacture the liquid crystal display device as already known (such as liquid crystal sealing, formation of color filters, mounting of driver IC, etc.), the liquid crystal display device of active matrix mode has been completed.

When the characteristics of the liquid crystal display device obtained in this Example were compared with the conventional type liquid crystal display device using organic siloxane dielectric film of 1.2 μm in thickness as the second interlayer dielectric film 30, the defects of pixel due to poor orientation of liquid crystal could be reduced by about 5%, and power consumption could be decreased by about 4%. Further, compared with the conventional type liquid crystal display device using a photosensitive acrylic film of 2.3 μm in thickness as the second interlayer dielectric film 30, panel transmissivity was improved by about 3%. Here, a liquid crystal display device using low temperature polysilicon TFT was taken as an example, while similar effects could be obtained when the interlayer dielectric film of the present invention was applied n the amorphous silicon TFT as shown in FIG. 3.

As described above, by Example 2, a high-performance liquid crystal display device with high image visibility with low power consumption can be manufactured at low cost.

What is claimed is:

1. A display device, comprising at least a substrate, a thin-film transistor, a conductive source wiring, a conductive drain wiring, a conductive gate electrode, a conductive pixel electrode, and an interlayer dielectric film provided between said conductive pixel electrode and at least a portion of at least one of said conductive source wiring, said conductive drain wiring, and said conductive gate electrode, wherein:
   said interlayer dielectric film is an organic siloxane dielectric film containing silicon, oxygen, carbon, hydrogen and nitrogen;
   a film thickness of the thickest portion of said interlayer dielectric film is 1.5 μm to 5 μm; and
   a ratio of nitrogen content to silicon content in said interlayer dielectric film is 0.04 to 0.5 in element ratio.

2. A display device according to claim 1, wherein;
   a ratio of carbon content to silicon content in said interlayer dielectric film is 0.01 to 2 in element ratio.

3. A display device according to claim 1, wherein;
   main organic group of said interlayer dielectric film is a methyl group.

4. A display device according to claim 1, wherein;
   a semiconductor layer of said thin-film transistor is amorphous silicon or polysilicon.

5. A display device according to claim 1, wherein said interlayer dielectric film is provided between said conductive pixel electrode and said conductive source wiring, between said conductive pixel electrode and at least a portion of said conductive drain wiring, and between said conductive pixel electrode and said conductive gate electrode.

6. An organic EL display device, comprising at least a substrate, a thin-film transistor, a conductive layer, and an interlayer dielectric film, wherein:
   said interlayer dielectric film is an organic siloxane dielectric film containing silicon, oxygen, carbon, hydrogen and nitrogen;
   a film thickness of the thickest portion of said interlayer dielectric film is 1.5 μm to 5 μm; and
   a ratio of nitrogen content to silicon content in said interlayer dielectric film is 0.04 to 0.5 in element ratio.

7. An organic EL display device according to claim 6, wherein;
   a ratio of carbon content to silicon content in said interlayer dielectric film is 0.01 to 2 in element ratio.

8. An organic EL display device according to claim 6, wherein;
   main organic group of said interlayer dielectric film is a methyl group.

9. An organic EL display device according to claim 6, wherein;
   a semiconductor layer of said thin-film transistor is amorphous silicon or polysilicon.

10. An organic EL display device, comprising at least a substrate, a thin-film transistor, a conductive source wiring, a conductive drain wiring, a conductive gate electrode, a conductive pixel electrode, and an interlayer dielectric film provided between said conductive pixel electrode and at least a portion of at least one of said conductive source wiring, said conductive drain wiring, and said conductive gate electrode, wherein:
    said interlayer dielectric film is an organic siloxane dielectric film containing silicon, oxygen, carbon, hydrogen and nitrogen;
    a film thickness of the thickest portion of said interlayer dielectric film is 1.5 μm to 5 μm; and
    a ratio of nitrogen content to silicon content in said interlayer dielectric film is 0.04 to 0.5 in element ratio.

11. An organic EL display device according to claim 10, wherein;
    a ratio of carbon content to silicon content in said interlayer dielectric film is 0.01 to 2 in element ratio.

12. An organic EL display device according to claim 10, wherein;
    main organic group of said interlayer dielectric film is a methyl group.

13. An organic EL display device according to claim 10, wherein;
    a semiconductor layer of said thin-film transistor is amorphous silicon or polysilicon.

14. An organic EL display device according to claim 10, wherein said interlayer dielectric film is provided between said conductive pixel electrode and said conductive source wiring, between said conductive pixel electrode and at least a portion of said conductive drain wiring, and between said conductive pixel electrode and said conductive gate electrode.

* * * * *